US010546893B2

(12) United States Patent
Yoon et al.

(10) Patent No.: US 10,546,893 B2
(45) Date of Patent: Jan. 28, 2020

(54) VARIABLE RESISTIVE MEMORY DEVICE

(71) Applicant: SK hynix Inc., Icheon-si, Gyeonggi-do (KR)

(72) Inventors: Young Hee Yoon, Icheon-si (KR); Eun Jeong Kwak, Cheongju-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 71 days.

(21) Appl. No.: 15/492,129

(22) Filed: Apr. 20, 2017

(65) Prior Publication Data
US 2018/0061891 A1   Mar. 1, 2018

(30) Foreign Application Priority Data
Aug. 30, 2016  (KR) .................. 10-2016-0110960

(51) Int. Cl.
*H01L 27/24* (2006.01)
*H01L 45/00* (2006.01)

(52) U.S. Cl.
CPC .......... *H01L 27/2481* (2013.01); *H01L 45/06* (2013.01); *H01L 45/1233* (2013.01)

(58) Field of Classification Search
CPC ............. H01L 27/2481; H01L 27/2463; H01L 23/5223; H01L 45/06; H01L 45/1233
See application file for complete search history.

(56) References Cited

U.S. PATENT DOCUMENTS

| 2007/0111487 A1* | 5/2007 | Kim ................. H01L 27/24 438/478 |
| 2015/0206585 A1 | 7/2015 | Kim |
| 2016/0141003 A1* | 5/2016 | Saitoh ................. H01L 45/04 365/226 |

FOREIGN PATENT DOCUMENTS

KR    1020120043913 A    5/2012

* cited by examiner

*Primary Examiner* — Timor Karimy
(74) *Attorney, Agent, or Firm* — William Park & Associates Ltd.

(57) ABSTRACT

A variable resistive memory device may include a semiconductor substrate, a device layer, an upper metal interconnect, a plurality of memory cells, and an uppermost metal interconnect. The device layer may be formed on the semiconductor substrate including memory cell array regions, and may include a plurality of lower metal interconnect layers. The upper metal interconnect may be arranged on the device layer, and may include a plurality of metal patterns. The plurality of memory may be arranged over the device layer in which the upper metal interconnect is formed and are in contact with certain metal patterns selected from the metal patterns constituting the upper metal interconnect. The uppermost metal interconnect may be located over the plurality of memory cells, and may be in contact with other portion of the metal patterns constituting the upper metal interconnect.

21 Claims, 11 Drawing Sheets

FIG. 4
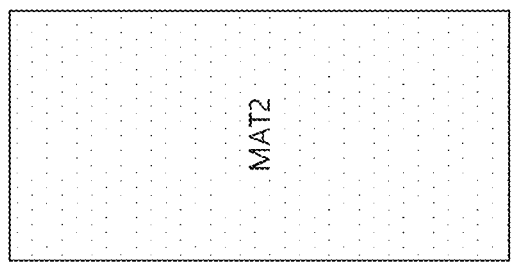
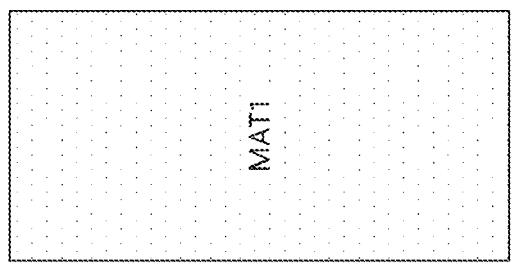
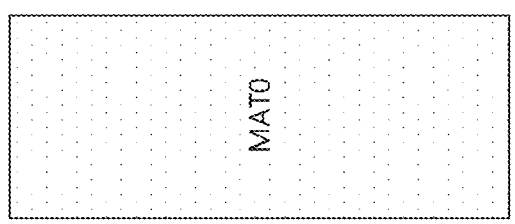
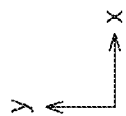

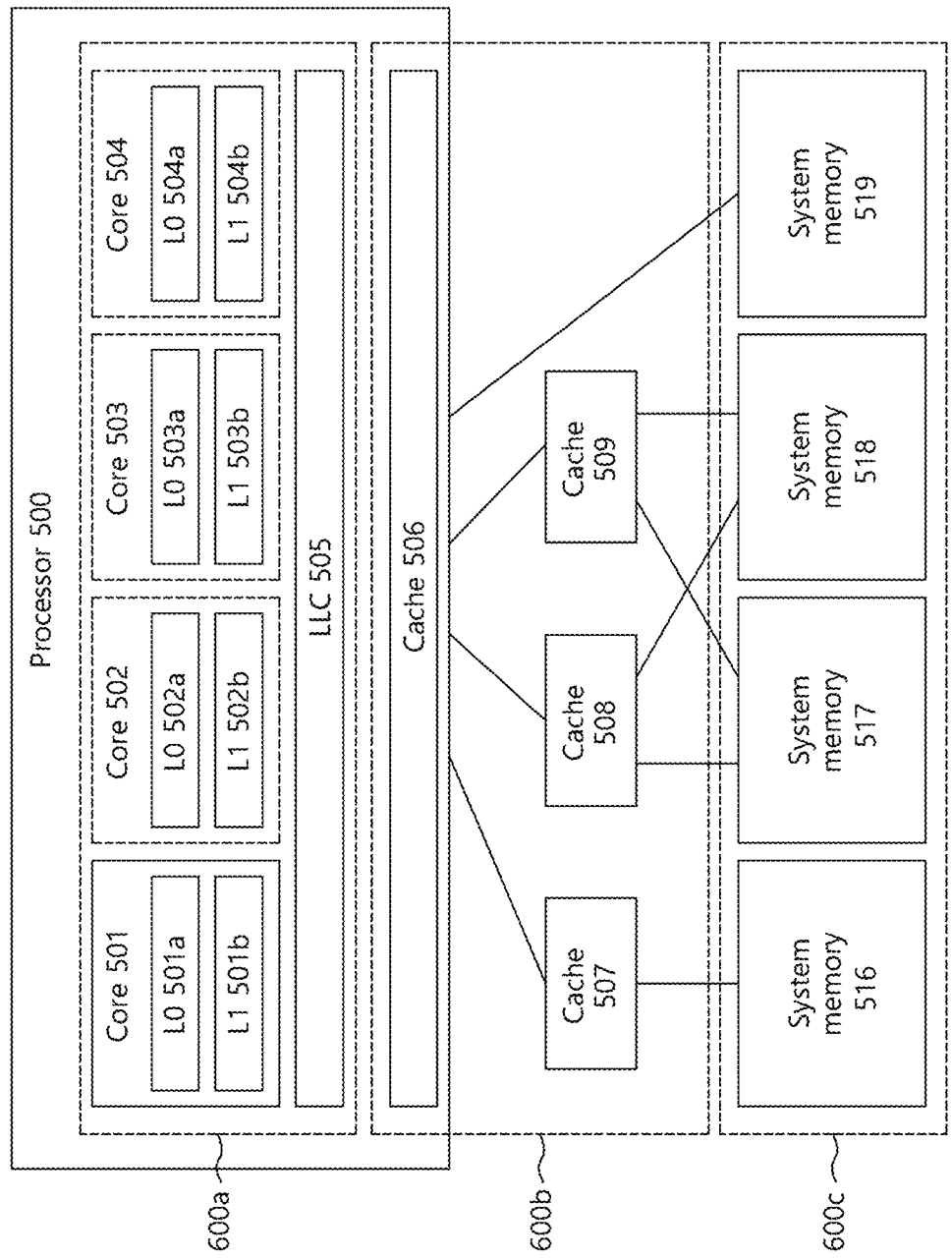

VARIABLE RESISTIVE MEMORY DEVICE

CROSS-REFERENCES TO RELATED APPLICATION

The present application claims priority under 35 U.S.C. § 119(a) to Korean application number 10-2016-0110960 filed on Aug. 30, 2016, in the Korean Intellectual Property Office, which is incorporated herein by reference in its entirety.

BACKGROUND

1. Technical Field

Various embodiments may generally relate to a variable resistive memory device, and more particularly to a power mesh technology of a variable resistive memory device.

2. Related Art

In general, a semiconductor memory is a data storage device that is implemented on a semiconductor integrated circuit and used in computers or other electronic apparatuses. Examples of the semiconductor memory may include, among other things, random access memories (RAMs), read only memories (ROMs), dynamic RAMs (DRAMs), synchronous DRAMs (SDRAMs), flash memories, and variable resistive memory devices.

A unit cell of the variable resistive memory device may include at least one switching element and at least one resistor element. The variable resistive memory device may identify data bits by detecting a resistance of the resistor element. Examples of the variable resistive memory device may include a programmable conductor random access memory (PCRAM), a resistive RAM (ReRAM), and a phase-change RAM (PRAM).

In recent years, researches on the variable resistive memory devices such as the PCRAM have rapidly progressed, and a PCRAM device having two-terminals and simultaneously performing a switching function and a memory function are being developed.

SUMMARY

In an embodiment of the present disclosure, a variable resistive memory device may include a semiconductor substrate, a device layer, an upper metal interconnect, a plurality of memory cells, and an uppermost metal interconnect. The semiconductor substrate may include a plurality of memory cell array regions. The device layer may be formed on the semiconductor substrate, and may include a plurality of lower metal interconnect layers. The upper metal interconnect may be arranged on the device layer, and may include a plurality of metal patterns. The plurality of memory cells may be arranged over the device layer in which the upper metal interconnect is formed, and may be in contact with certain metal patterns selected from the metal patterns constituting the upper metal interconnect. The uppermost metal interconnect may be located over the plurality of memory cells, and may be in contact with other portion of the metal patterns constituting the upper metal interconnect. The uppermost metal interconnect may include a first uppermost metal interconnect, which receives a first voltage, and a second uppermost metal interconnect, which receives a second voltage having a voltage different from the first voltage. A reservoir capacitor may be formed between the first and second uppermost metal interconnects which are alternately arranged.

In an embodiment of the present disclosure, a variable resistive memory device may include a semiconductor substrate, a metal interconnect, an upper metal interconnect, and a plurality of memory cells. The semiconductor substrate may include a plurality of memory cell array regions. The metal interconnect may be formed over the semiconductor substrate. The upper metal interconnect may be formed over the metal interconnect, and may be arranged to traverse the plurality of memory cell array regions. The plurality of memory cells may be arranged in each of the plurality of memory cell array regions between the metal interconnect and the upper metal interconnect. The upper metal interconnect may include a first upper metal interconnect and a second upper metal interconnect alternately arranged on the same plane. The first upper metal interconnect may receive a first power voltage, and the second upper metal interconnect may receive a second power voltage having a different voltage level from the first power voltage.

These and other features, aspects, and embodiments are described below in the section entitled "DETAILED DESCRIPTION"

BRIEF DESCRIPTION OF THE DRAWINGS

The above and other aspects, features and advantages of the subject matter of the present disclosure will be more clearly understood from the following detailed description taken in conjunction with the accompanying drawings, in which:

FIGS. 4 to 8 are plan views illustrating an example of a variable resistive memory device in respective processes according to an embodiment of the present disclosure;

FIG. 12 is a diagram illustrating an example of a computer system according to an embodiment of the present disclosure.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Figure 1:
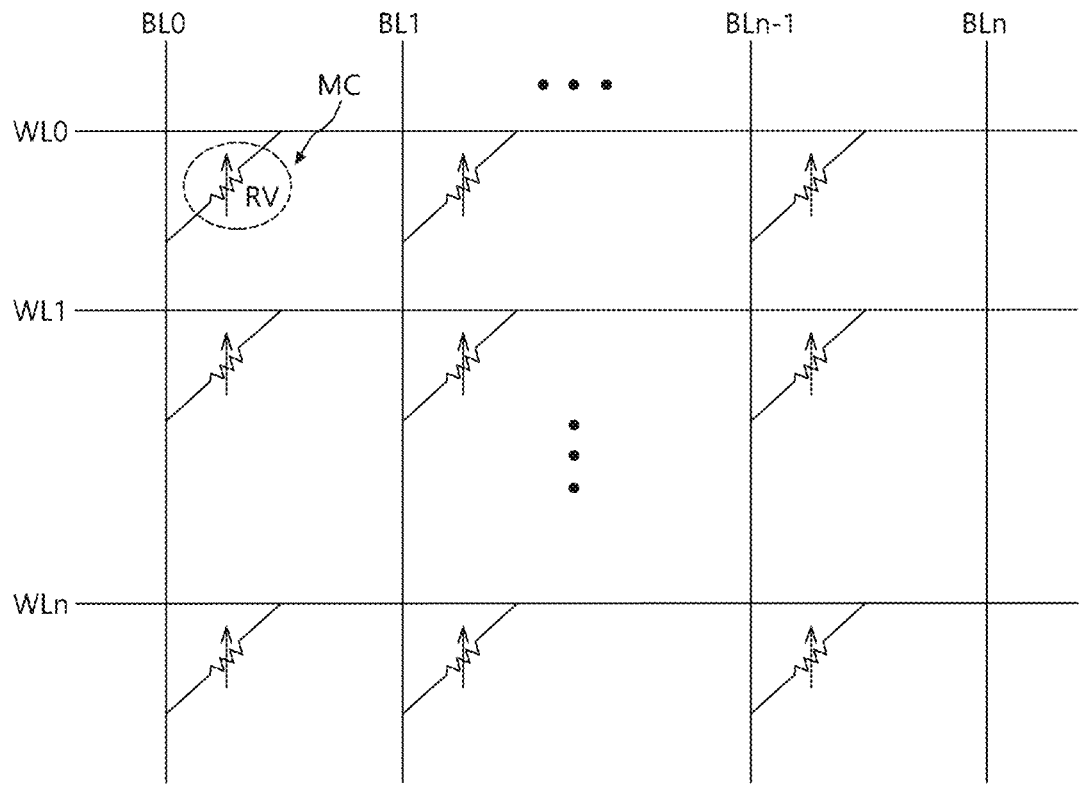
FIG. 1 is a schematic circuit diagram illustrating an example of a cell array of a variable resistive memory device according to an embodiment of the present disclosure.

FIG. 1 is a schematic circuit diagram illustrating an example of a cell array of a variable resistive memory device according to an embodiment of the present disclosure.

Referring to FIG. 1, a cell array region (hereinafter, referred to as "MAT") of a variable resistive memory device may include a plurality of word lines WL0 to WLn and a plurality of bit lines BL0 to BLn arranged to cross each other. Each memory cell may be formed by coupling a variable resistor Rv corresponding to a storage layer to each of intersections between the plurality of word lines WL0 to WLn and the plurality of bit lines BL0 to BLn. The variable resistor Rv may be formed of, for example, a phase-change material such as a chalcogenide material. A resistance value of the variable resistor may be varied by creating a voltage difference between a voltage level of the word line and a voltage level of the bit line.

Figure 2:
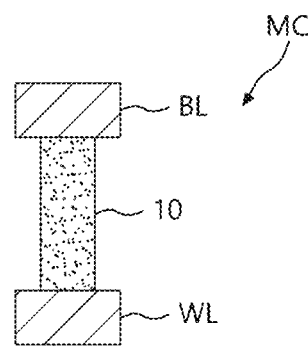
FIG. 2 is a schematic cross-sectional diagram illustrating an example of a unit memory cell of a variable resistive memory device according to an embodiment of the present disclosure.

Unit memory cells constituting a MAT in the variable resistive memory device may include a word line WL, a variable resistor layer 10, a bit line BL, as illustrated in FIG. 2. The variable resistor layer 10 (see Rv of FIG. 1) may be formed of, for example, a chalcogenide material, which can change an internal structure (e.g., amorphous structure or crystalline structure) of the variable resistor layer 10 by a voltage difference between the word line WL and the bit line BL.

Figure 3:
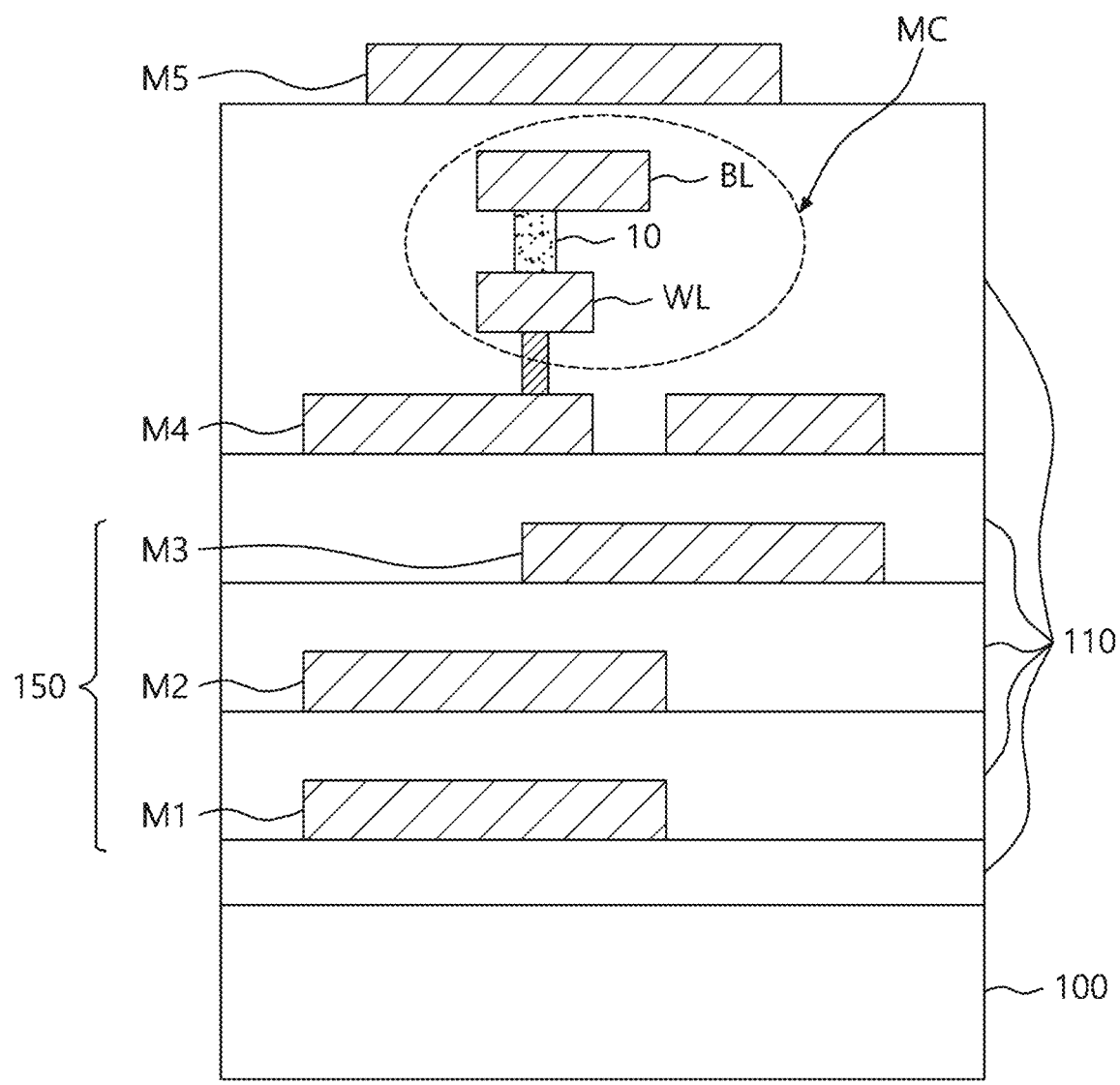
FIG. 3 is a schematic cross-sectional diagram illustrating an example of a variable resistive memory device including a two-terminal memory cell according to an embodiment of the present disclosure.

When two-terminal memory cells are integrated on a semiconductor substrate, the two-terminal memory cells may be located between metal interconnects. As illustrated in FIG. 3, the two-terminal memory cell may be located between a fourth metal interconnect M4 and a fifth metal interconnect M5. The reference numeral "100" denotes the semiconductor substrate, "110" denotes an interlayer insulating layer, "M1" denotes a first metal interconnect, "M2" denotes a second metal interconnect, and "M3" denotes a third metal interconnect. A control circuit (not illustrated) may be located between the semiconductor substrate 100 and the interlayer insulating layer 110. The reference numeral "150" denotes a device layer including the control circuit, the interlayer insulating layer, and the metal interconnects M1 to M3.

Figure 7:
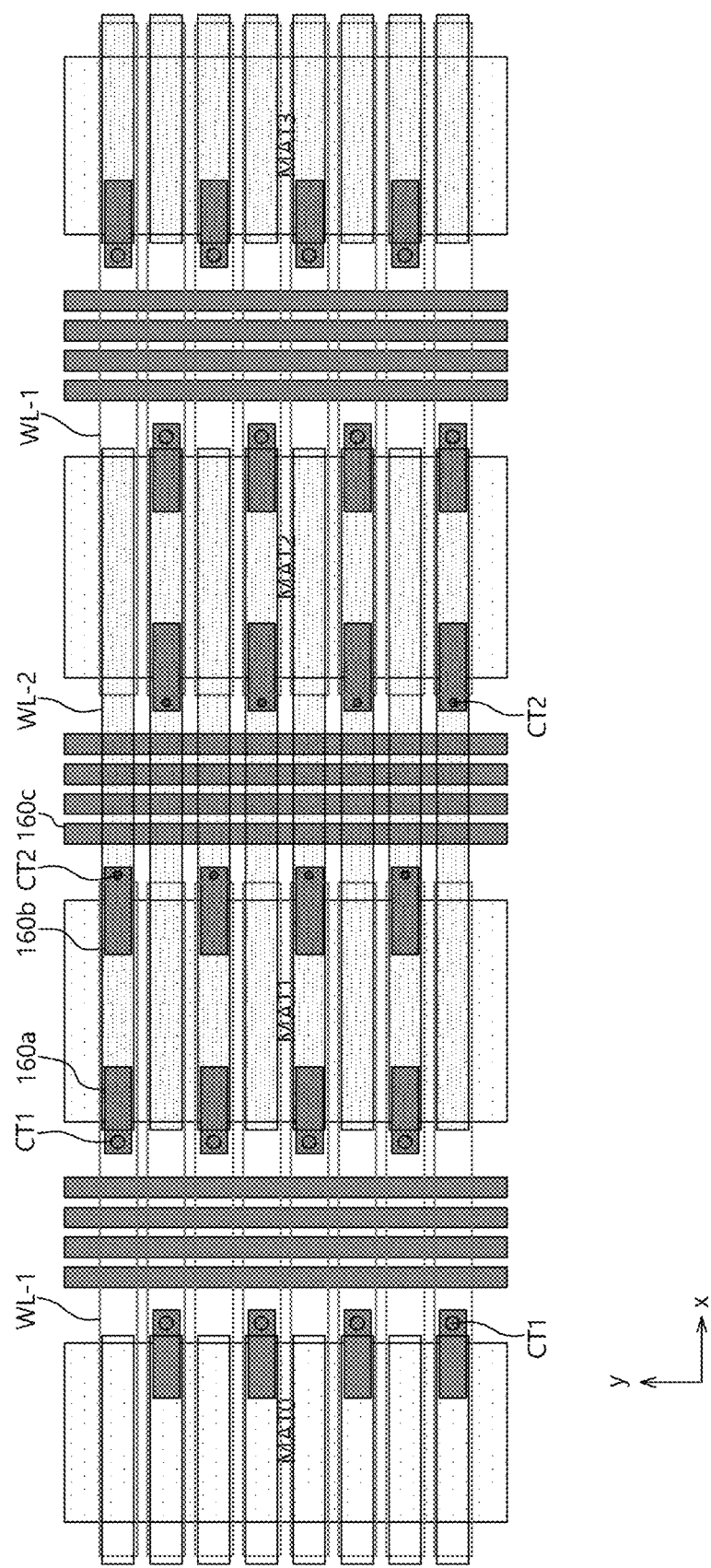
Figure 8:
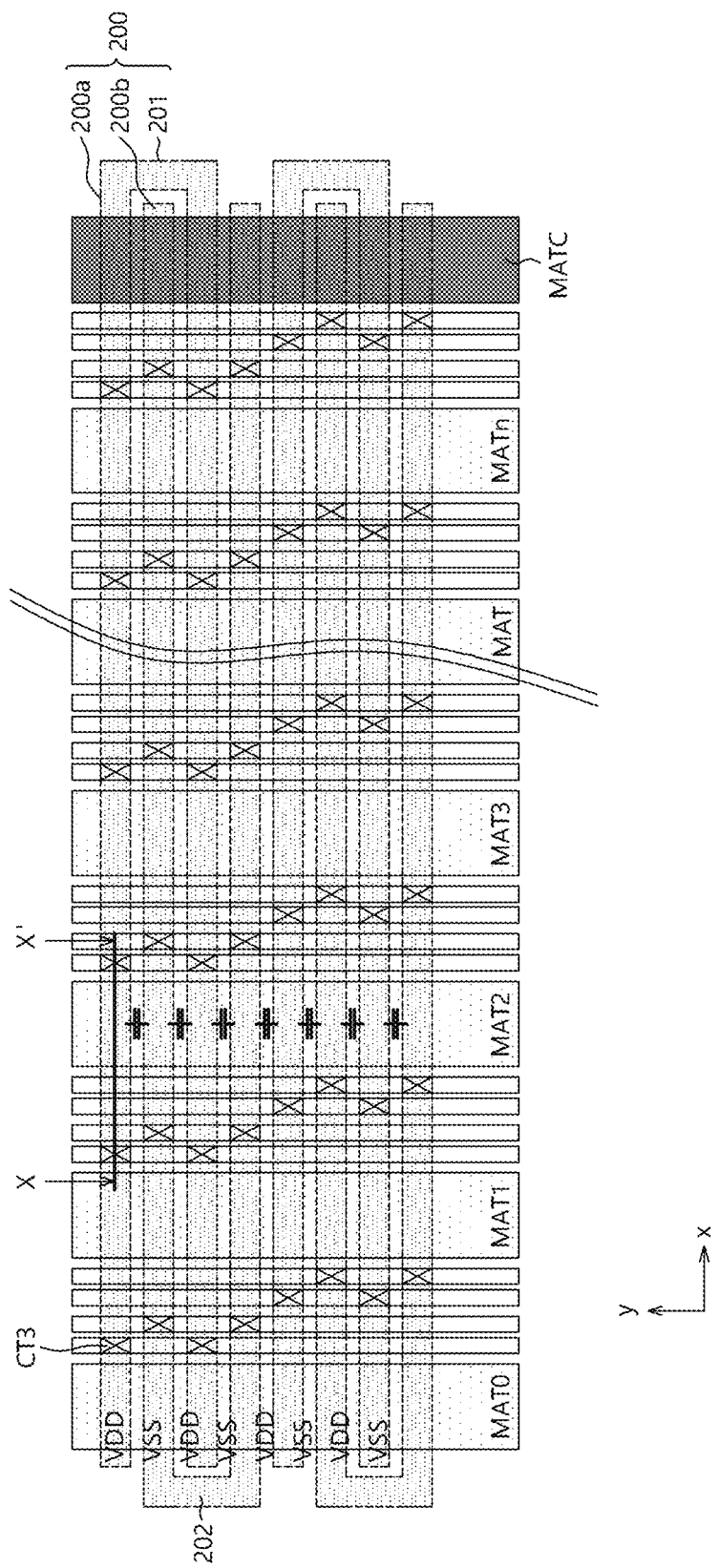
Figure 9:
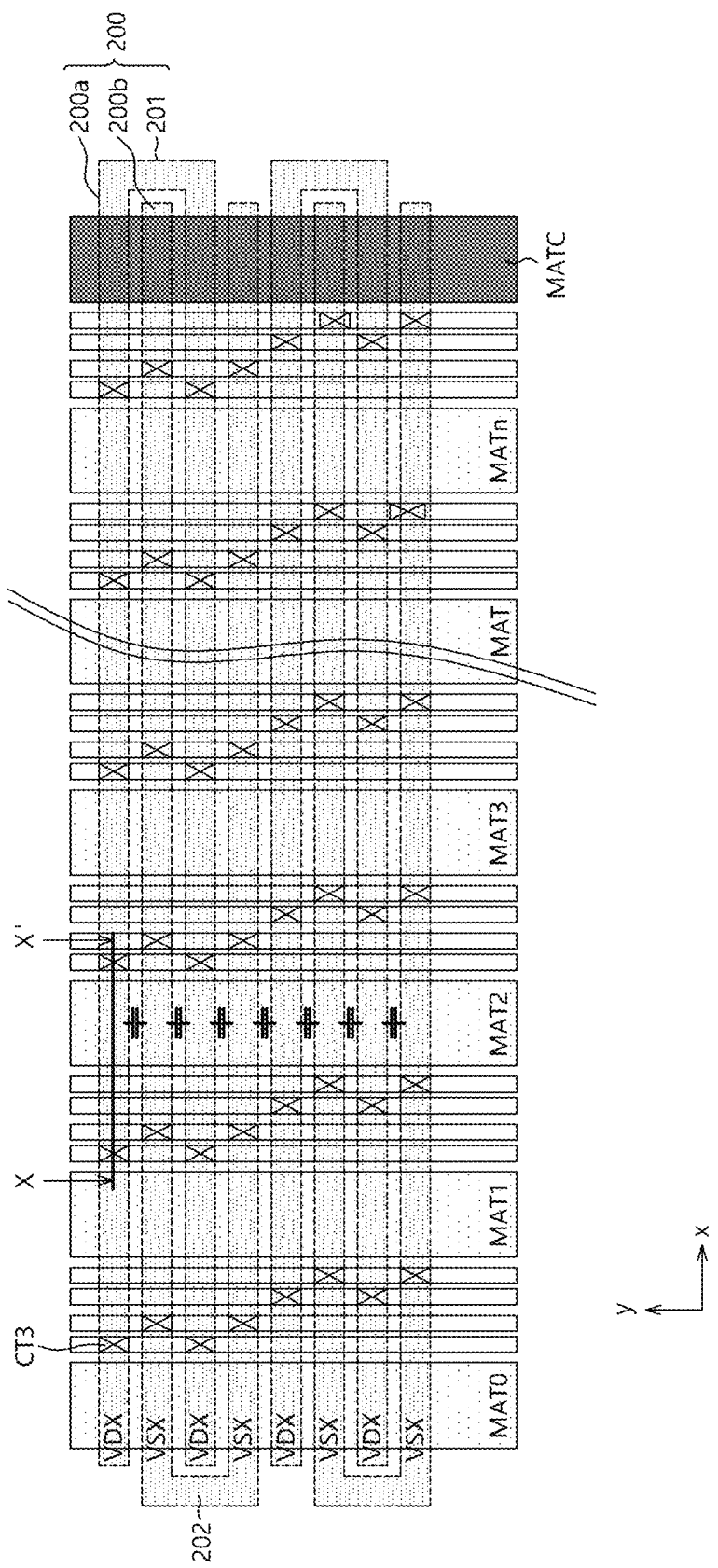
FIG. 9 is a plan view illustrating an example of a variable resistive memory device according to an embodiment of the present disclosure.
Figure 10:
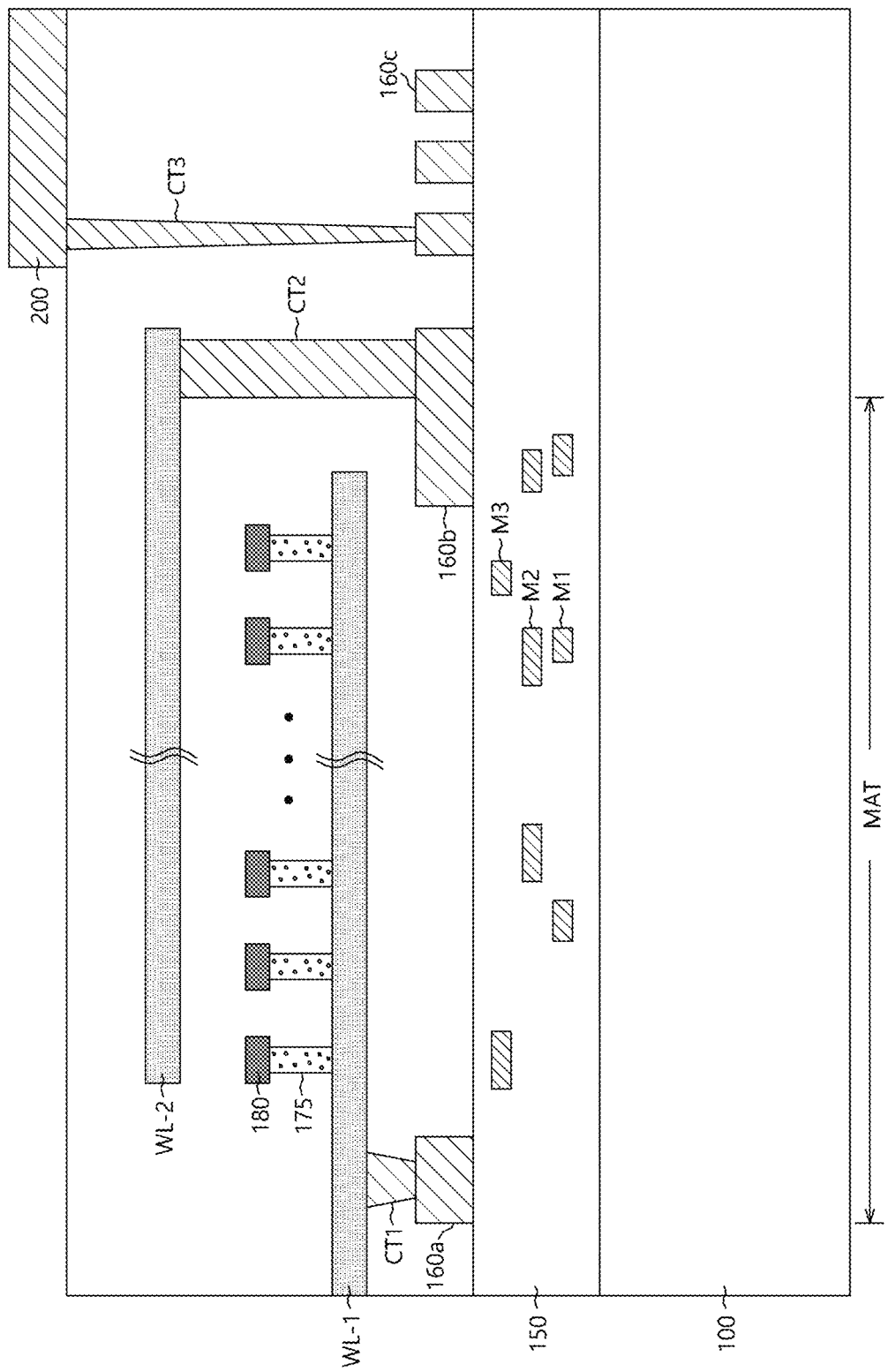
FIG. 10 is a cross-sectional diagram illustrating an example of the variable resistive memory device taken along line X-X' of FIG. 8.

FIGS. 4 to 8 are plan views illustrating an example of a method of fabricating a variable resistive memory device according to an embodiment of the present disclosure, and FIG. 9 is a plan view illustrating an example of a variable resistive memory device according to an embodiment of the present disclosure. FIG. 10 is a cross-sectional diagram illustrating an example of the variable resistive memory device taken along line X-X' of FIG. 8.

Referring to FIGS. 4 and 10, a plurality of mats MAT0 to MAT3 may be formed on the semiconductor substrate 100. The plurality of mats MAT0 to MAT3 may be arranged, for example, in a matrix form along an x-direction (an extension direction of a word line) and a y-direction (an extension direction of a bit line) of FIG. 4. The mats MAT0 to MAT3 may be arranged at intervals in the x-direction and the y-direction, and the device layer 150 (refer to FIG. 3) may be formed in a region defined as the mat MAT0 to MT3. Although not illustrated in detail in drawings, an insulating layer may be formed on the semiconductor substrate 100 where the mats MAT0 to MAT3 are defined. Further, the device layer 150 including a control circuit, an interlayer insulating layer, and multi-layered metal interconnects such as the first to third metal interconnects M1 to M3 may be formed in the insulating layer. Further, the insulating layers may also be located in spaces between the mats MAT0 to MAT3.

Figure 5:
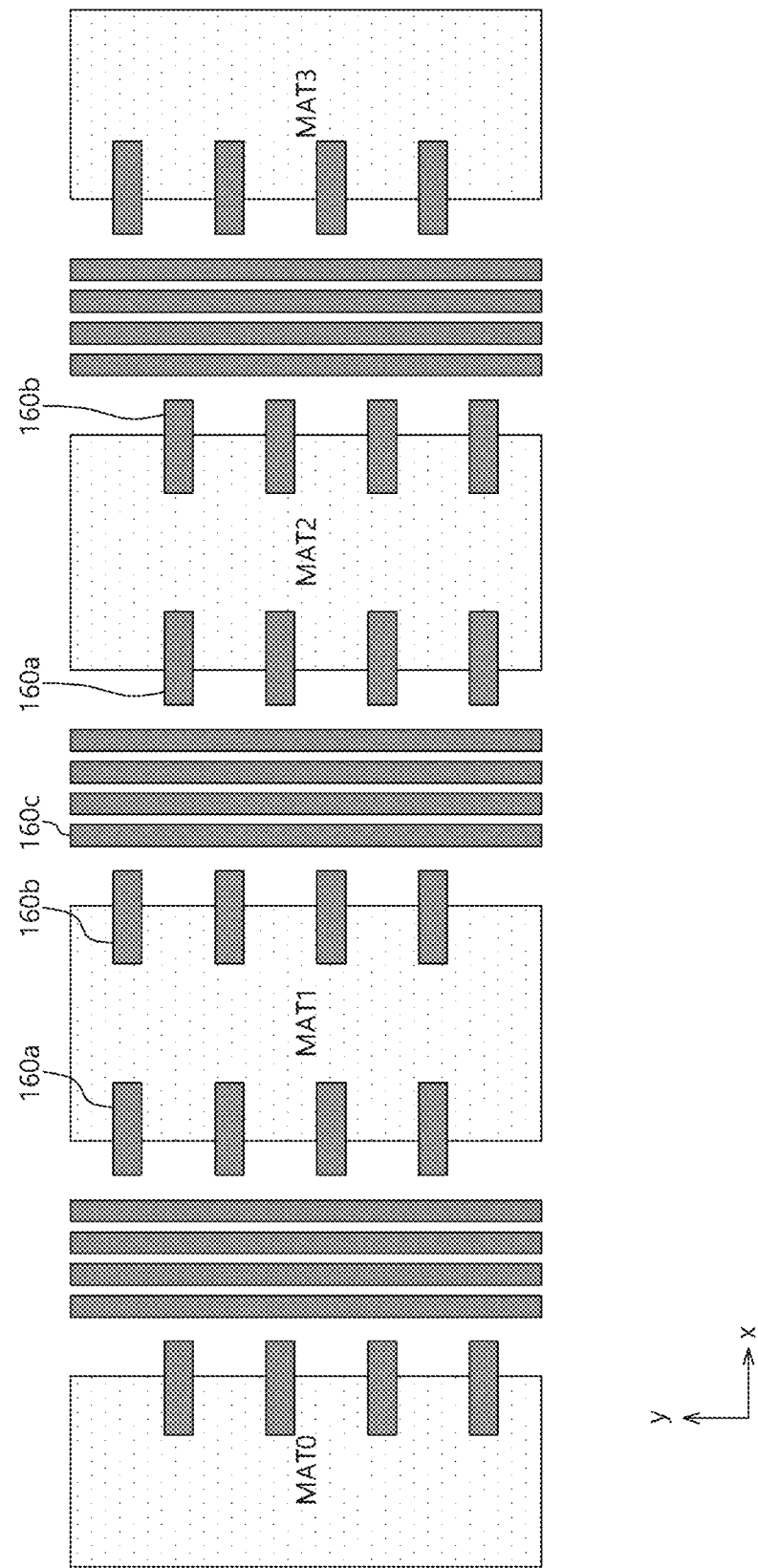

Referring to FIGS. 5 and 10, a plurality of first patterns 160a, a plurality of second patterns 160b, and a plurality of third patterns 160c may be formed on the device layer 150 to be arranged in a regular array. The plurality of first patterns 160a may be arranged at regular intervals along a first side of each mat MAT0 to MAT3. The first patterns 160a may extend along the x-direction of FIG. 5, for example, an extension direction of a word line to be arranged later. However, an extension length of the first pattern 160a may be smaller than a width of a short side of the mat. For example, the first patterns 160a located in even-numbered mats MAT0 and MAT2 may be located in regions in which even-numbered word lines are to be arranged. The first patterns 160a located in odd-numbered mats MAT1 and MAT3 may be located in regions in which odd-numbered word lines are to be arranged. The odd-numbered word lines may refer to word lines arranged in odd-numbered rows of the mat MAT0 to MAT3 and the even-numbered word lines may refer to word lines arranged in even-numbered rows of the mat MAT0 to MAT3.

The plurality of second patterns 160b may be arranged at regular intervals along a second side of each mat MAT0 to MAT3. Here, the second side may be the opposite side of the first side. The second patterns 160b may extend along the x-direction of FIG. 5, for example, the extension direction of the word line. However, the second pattern 160b may have a length smaller than the width of the short side of the mat. For example, the second patterns 160b located in the even-numbered mat MAT0 and MAT2 may be located in the regions in which the even-numbered word lines are to be arranged. The second patterns 160b located in the odd-numbered mat MAT1 and MAT3 may be located in the regions in which the odd-numbered word lines are to be arranged.

The plurality of third patterns 160c may be arranged at regular intervals in each of the spaces between the mat MAT0 to MAT3. The third patterns 160c may extend in parallel along the y-direction of FIG. 5, for example, an extension direction of a bit line to be arranged later. For example, the third patterns 160c may have a length similar to a length of a long side of the mats MAT0 to MAT3.

The first to third patterns 160a to 160c may be formed of a metal layer. For example, the first to third patterns 160a to 160c may correspond to the fourth metal interconnect. The first metal interconnect M1 is disposed over the semiconductor substrate, and the second metal interconnect M2 is disposed over the first metal interconnect M1. The third metal interconnect M3 is disposed over the second metal interconnect M2, and the fourth metal interconnect may be disposed over the third metal interconnect M3. The arrangement form of the first to third patterns 160a to 160c is not limited to the arrangement form discussed above, and may be variously modified.

Figure 6:
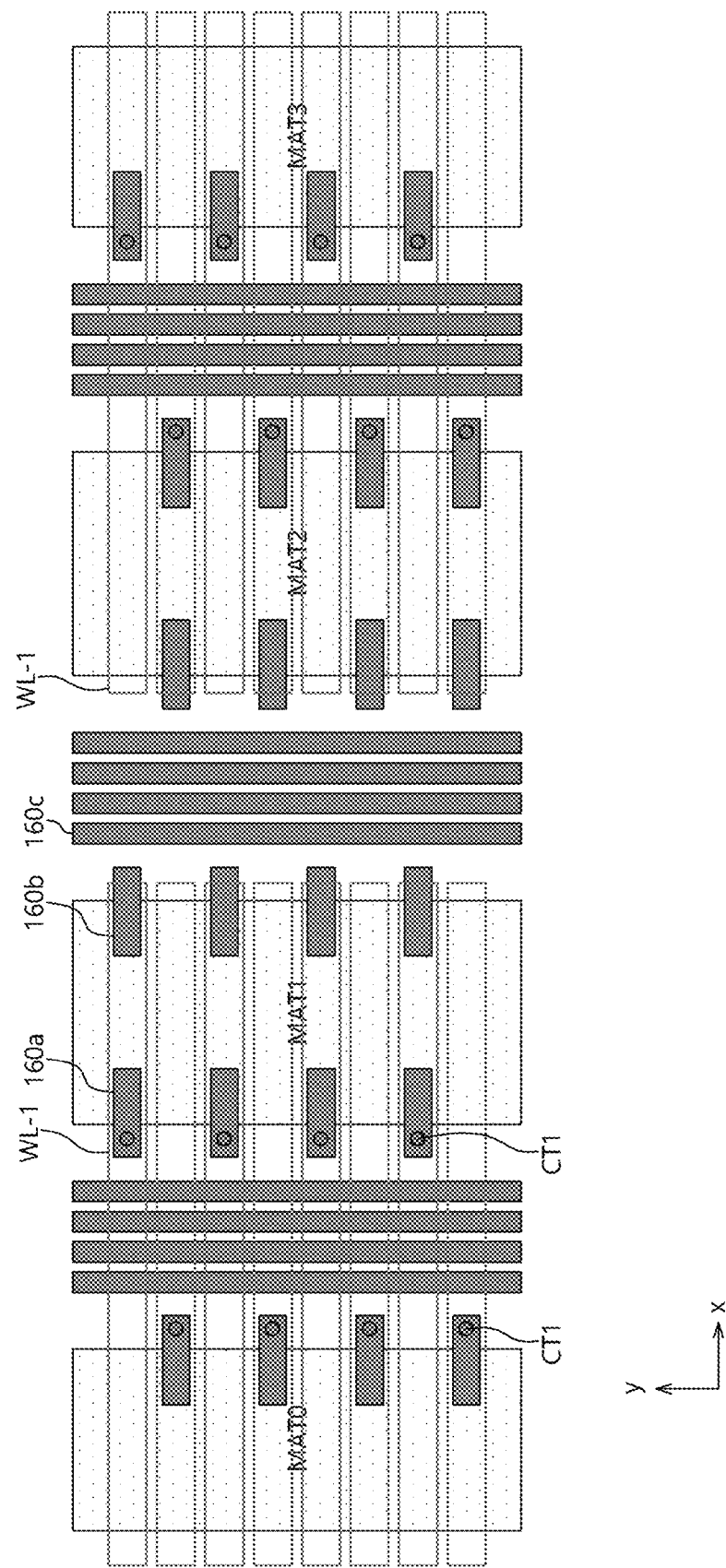

Referring to FIGS. 6 and 10, a plurality of first word lines WL-1 may be arranged over the mats MAT0 to MAT3. The first word lines WL-1 may extend in the x-direction of FIG. 6, and may be arranged over two mats adjacent in the x-direction. For example, one first word line may be arranged on a first mat MAT0 and a second mat MAT1 continuously, and may be arranged on a third mat MAT2 and a fourth mat MAT3 continuously.

The plurality of first word lines WL-1 may be in selective contact with the first patterns 160*a* and the second patterns 160*b*. For example, odd-numbered first word lines WL-1 may be electrically coupled through contacts CT1 to the first patterns 160*a* on the odd-numbered mats MAT1 and MAT3 located below the odd-numbered first word lines WL-1. Even-numbered first word lines WL-1 may be electrically coupled through the contacts CT1 to the second patterns 160*b* on the even-numbered mats MAT0 and MAT2 among the mats MAT0 to MAT3 located below the even-numbered first word lines WL-1.

The first word lines WL-1 may be formed of, for example, a metal nitride layer or a doped polysilicon layer.

A plurality of storage patterns 175 and a plurality of bit lines 180 may be formed over the mats MAT0 to Mat3, and as a result a plurality of memory cells may be formed (see FIG. 10). The bit lines 180 may be arranged to cross the first word lines WL-1 on each of the mats MAT0 to MAT3. The plurality of storage patterns 175 may be located at intersections of the first word lines WL-1 and bit lines 180, respectively. The storage pattern 175 may be, for example, a chalcogenide layer.

Referring to FIGS. 7 and 10, a plurality of second word lines WL-2 may be arranged over the first word lines WL-1. The second word lines WL-2 may be arranged over adjacent two mats among the mats MAT0 to Mat3. The second word lines WL-2 may be formed in such a manner that the second word lines WL-2 are located in the same rows as the first word lines WL-1 and partially overlap the first word lines WL-1 electrically separated from the second word lines WL-2. For example, when the first word lines WL-1 are allocated in common to the first mat MAT0 and the second mat MAT1 and to the third mat MAT2 and the fourth mat MAT3, the second word lines WL-2 may be allocated in common to the second mat MAT1 and the third mat MAT2. Although the first and second word lines WL-1 and WL-2 are arranged in different levels, the first and second word lines WL-1 and WL-2 located in the same row may operate as if they are one word line. By arranging the first and second word lines WL-1 and WL-2 separately from each other, the interconnect resistance characteristics may be improved.

The second word lines WL-2 may be in selective contact with the first patterns 160*a* and the second patterns 160*b*. For example, odd-numbered second word lines WL-2 may be electrically coupled through second contacts CT2 to the second patterns 160*b* located in corresponding rows over the odd-numbered mats MAT1 and MAT3. Even-numbered second word lines WL-2 may be electrically coupled through the second contacts CT2 to the first patterns 160*a* located in corresponding rows over the even-numbered mats MAT0 and MAT2. Accordingly, the plurality of memory cells may be electrically coupled to the fourth interconnect including the first and second patterns 160*a* and 160*b*.

The second word lines WL-2 may be formed of a metal nitride layer or a doped polysilicon layer like the first word lines WL-1.

As illustrated in FIGS. 8 and 10, a plurality of first power interconnects 200*a* and a plurality of power interconnects 200*b* may be formed as a fifth metal interconnect, which is a metal interconnect arranged at the highest level on the plurality of mats MAT0 to MAT3. For clarity, the first patterns 160*a*, the second patterns 160*b*, the first word lines WL-1, the second word lines WL-2, and the bit line 180 located over the mats are omitted in FIG. 8.

The plurality of first power interconnects 200*a* and the plurality of second power metal interconnects 200*b* may extend parallel to each other to traverse the plurality of mats (hereinafter, referred to as "mat row") arranged in a row direction (e.g., the x-direction of FIG. 8). For example, the first power interconnect 200*a* and the second power interconnect 200*b* may be alternately arranged. The first power interconnect 200*a* may receive, for example, an external voltage VDD, and the second metal interconnect 200*b* may receive, for example, a ground voltage VSS. The first power interconnect 200*a* and the second power interconnect 200*b* may be arranged, for example, at the same pitch as the word lines WL-1 and WL-2. Accordingly, a parasitic capacitor may be formed between the power interconnects 200*a* and 200*b*, and thus may be used as a reservoir capacitor.

The first power interconnect 200*a* may be electrically coupled through third contact CT3 to one of the third patterns 160*c* located in each of the spaces between the mats MAT0 to MAT3. The second power interconnect 200*b* may also be electrically coupled through the third contacts CT3 to another one of the third patterns 160*c* located in each of the spaces between the mats MAT0 to MAT3. For example, the third contact CT3 coupled to the first power interconnect 200*a* and the third contact CT3 coupled to the second power interconnect 200*b* may be coupled to different third patterns 160*c*. A plurality of third contacts CT3 may be provided to equalize signal transfer characteristics in the mats.

Adjacent first power interconnects 200*a* may be electrically coupled to each other through a connection portion 201 disposed at an edge of the mat row. Similarly, adjacent second power interconnects 200*b* may be electrically coupled to each other through a connection portion 202 disposed at an edge of the mat row. Since the first power interconnects 200*a* and the second power interconnects 200*b* are located on the same plane, the connection portion 201, which couples the first interconnects 200*a* to each other, and the connection portion 202, which couples the second interconnects 200*b* to each other, may be spaced apart from each other so as to prevent the first and second power interconnects 200*a* and 200*b* from being short-circuited. If the connection portion 201 is located next to a side of an outermost mat, the connection portion 202 may be located next to a side of the other outermost mat. For example, the connection portion 201 may be located next to an outer side of a control block MATC, and the connection portion 202 may be located next to an outer side of the first mat MAT0.

Although it has been described that the first power interconnect 200*a* receives the external voltage VDD and the second power interconnect 200*b* receives the ground voltage VSS, the first power interconnect 200*a* may receive a first internal voltage VDX instead of the external voltage VDD, and the second power interconnect 200*b* may receive a second internal voltage VSX instead of the ground voltage VSS as illustrated in FIG. 9.

Figure 11:
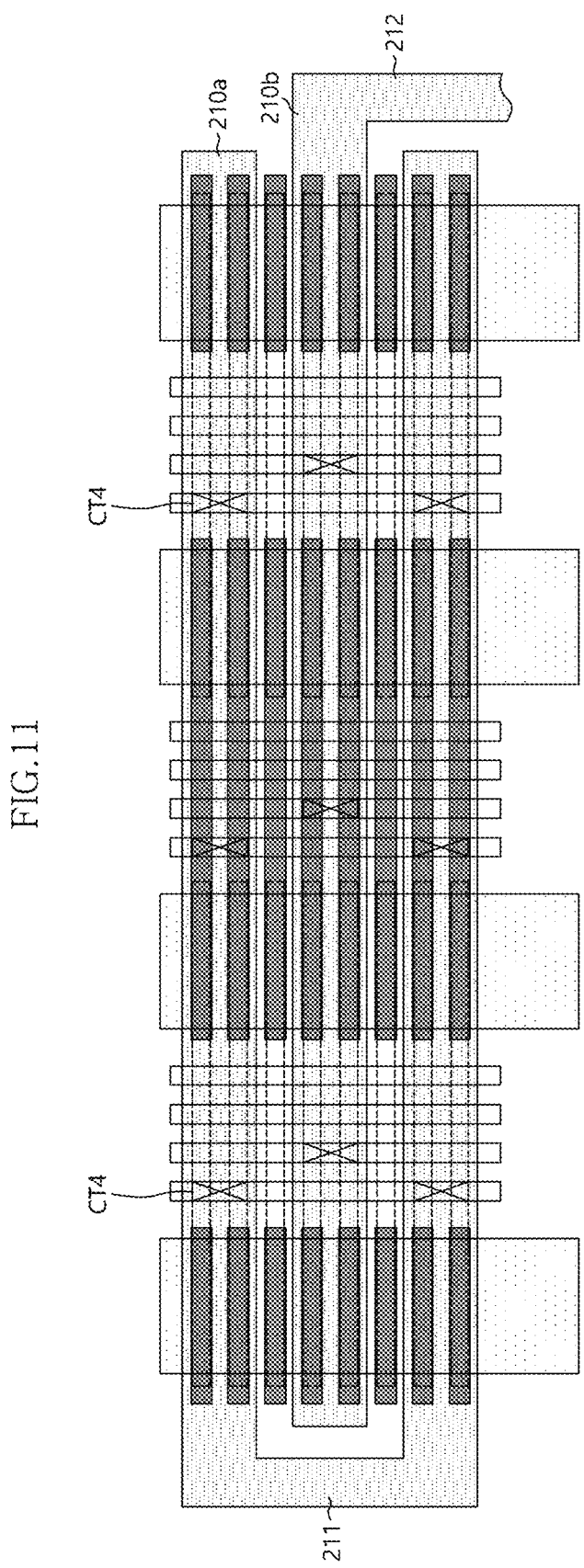
FIG. 11 is a plan view illustrating a variable resistive memory device according to an embodiment of the present disclosure.

Although the first power interconnects 200*a* and the second power interconnects 200*b* of FIGS. 8 and 9 have the same pitch as the word line, first power interconnects 210*a* and second power interconnects 210*b* may have a different pitch from the word line so long as they are wide enough to cover a pair of word lines as illustrated in FIG. 11. Here, the first and second power interconnects 210*a* and 210*b* may be alternately arranged. However, the first power interconnect 210*a* and the second power interconnect 210*b* may have a relatively large linewidth, and thus contacts CT4, which are in contact with the third patterns 160*c*, may have a sufficient contact area. Adjacent first power interconnects 210a may be selectively coupled to each other through a connection portion 211, and adjacent second power interconnects 210b may be selectively coupled to each other through a connection portion 212.

In an embodiment, over the mat in which the memory cells of the variable resistive memory device, for example, two-terminal cross-point PRAM cells are formed, the power interconnects having voltage differences are alternately arranged, and a capacitance generated between the power interconnects may be used as a reservoir capacitance. The power interconnects may be electrically coupled to metal interconnects arranged between the mats, and thus a stable capacitance operation may be performed.

FIG. 12 is a diagram illustrating a computer system in accordance with example embodiments.

Referring to FIG. 12, a computer system of this example embodiment may include a processor 500, a cache memory 507 to 509, and a plurality of system memories 516 to 519.

The processor 500 may include a plurality of cores 501 to 504. Each of the cores 501 to 504 may include upper-level caches L0_501a to L0_ 504a and middle-level caches L1_501b to L0_504b. The upper-level caches L0_501a to L0_504a and the middle-level caches L1_501b to L1_504b may be used for each corresponding cores 501 to 504.

The processor 500 may include lower-level caches LLC_ 505 shared by the cores 501 to 504. The processor 500 may further include a common cache 506 provided as a near memory.

A cache group may include a plurality of sub-caches 507 to 509. The cache group may be arranged between the processor 500 and the system memories 516 to 519. Each of the sub-caches 507 to 509 may be used for each corresponding system memory 516 to 519 divided by addresses. For example, the first sub-cache 507 may be used as a memory controller of the first system memory 516 corresponding to a first address section. The second sub-cache 508 may be used as a memory controller for controlling a non-overlapped portion between the second system memory 517 and the third system memory 518 corresponding to a second address section.

The system memories 516 to 519 may include a memory directly accessed by a software application executed on the processor 500. In contrast, the caches 501a to 509 may store information that is referenced by the cores 501 to 504 executing commands when running the software application. The system memories 516 to 519 may be manually operated as a part of the processor and/or automatically operated by the software.

The system memories 516 to 519 may include a far memory and a near memory. Each of the far memory and the near memory may be a PRAM memory including a reservoir capacitor formed by the power interconnects according to an embodiment.

The computer system according to an embodiment may be interfaced with a dual in-line memory module (DIMM) that is used as a storage device on which the semiconductor integrated circuit device is mounted. The semiconductor integrated circuit device mounted on the DIMM may include the PRAM according to an embodiment.

The DIMM and the computer system (e.g., a CPU package) may use a DRAM channel such as a DDR3, DDR4, DDR5, etc., as an interface. Reference numerals 600a, 600b and 600c denotes functional blocks into which the computer system in an embodiment is divided, and may be a cache for an internal processor, a near memory operating as a remote memory cache, and a system memory, respectively.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A variable resistive memory device comprising:
a semiconductor substrate in which a plurality of memory cell array regions are defined;
a device layer formed on the semiconductor substrate and including a plurality of lower metal interconnects and a control circuit;
an upper metal interconnect arranged on the device layer and including a horizontal metal pattern connected to a plurality of memory cells and a perpendicular metal pattern arranged to be perpendicular to the horizontal metal pattern;
the plurality of memory cells arranged over the device layer in which the upper metal interconnect is formed corresponding to the plurality of memory cells array regions, each of the plurality of memory cells including a variable resistor layer; and
an uppermost metal interconnect located over the plurality of memory cells and electrically connected to the perpendicular pattern,
wherein the uppermost metal interconnect includes a first uppermost metal interconnect, which receives a first voltage, and a second uppermost metal interconnect, which receives a second voltage having a voltage different from the first voltage, the first uppermost metal interconnect and the second uppermost metal interconnect are alternately arranged and a reservoir capacitor is formed between the first and second uppermost metal interconnects.

2. The variable resistive memory device of claim 1, wherein each of the plurality of memory cells includes:
a word line selectively coupled to the horizontal metal pattern of the upper metal interconnect; and
a bit line arranged to traverse the word line;
wherein the variable resistor layer is located at an intersection between the word line and the bit line.

3. The variable resistive memory device of claim 2, wherein the word line includes:
a first word line located over the upper metal interconnect; and
a second word line located over the first word line to partially overlap the first word line when viewed from above.

4. The variable resistive memory device of claim 3, wherein the bit line is located over the first word line, and the second word line is located over the bit line.

5. The variable resistive memory device of claim 3, wherein the horizontal metal pattern of the upper metal interconnect includes:
a first pattern which is in contact with the first word line; and
a second pattern which is in contact with the second word line, and
wherein the perpendicular metal pattern of the upper metal interconnect includes a plurality of third patterns which are in contact with the first and second of uppermost metal interconnects.

6. The variable resistive memory device of claim 5, wherein the first pattern is arranged in an edge of the memory cell array region to overlap the first word line when viewed from above.

7. The variable resistive memory device of claim 6, wherein the second pattern is arranged in the other edge of the memory cell array region to overlap the second word line when viewed from above.

8. The variable resistive memory device of claim 5, wherein the plurality of third patterns are arranged between adjacent memory cell array regions.

9. The variable resistive memory device of claim 8, wherein a plurality of third patterns are arranged to be crossed to the uppermost metal connect in a line shape.

10. The variable resistive memory device of claim 9, wherein the first uppermost metal interconnect is in contact with one of the third patterns, and the second uppermost metal interconnect is in contact with another one of the third patterns.

11. The variable resistive memory device of claim 2, wherein the first uppermost metal interconnect and the second uppermost metal interconnect extend in a direction parallel to the word line and each arranged to correspond to the word line.

12. The variable resistive memory device of claim 11, wherein:
the first uppermost metal interconnect is electrically coupled to other first uppermost metal interconnect adjacent thereto through a first connection portion;
the second uppermost metal interconnect is electrically coupled to other second uppermost metal interconnect adjacent thereto through a second connection portion; and
the first connection portion and the second connection portion are arranged in opposite positions to each other.

13. The variable resistive memory device of claim 2, wherein each of the first uppermost metal interconnect and the second uppermost metal interconnect has a linewidth sufficient to cover two word lines.

14. The variable resistive memory device of claim 1, wherein:
the device layer includes a first to a third metal interconnects;
the upper metal interconnect corresponds to a fourth metal interconnect; and
the uppermost metal interconnect corresponds to a fifth metal interconnect.

15. The variable resistive memory device of claim 1, wherein the first voltage is an external voltage and the second voltage is a ground voltage.

16. The variable resistive memory device of claim 1, wherein the first voltage and the second voltage are internal voltages.

17. A variable resistive memory device comprising:
a semiconductor substrate including a plurality of memory cell array regions;
a metal interconnect formed over the semiconductor substrate;
an upper metal interconnect formed over the metal interconnect and arranged to pass through the plurality of memory cell array regions; and
a plurality of memory cells arranged in each of the plurality of memory cell array regions between the metal interconnect and the upper metal interconnect,
wherein the upper metal interconnect includes a first upper metal interconnect and a second upper metal interconnect alternately arranged on the same plane, the first upper metal interconnect receiving a first power voltage, the second upper metal interconnect receiving a second power voltage having a different voltage level from the first power voltage.

18. The variable resistive memory device of claim 17, wherein the metal interconnect includes:
a plurality of first patterns and a plurality of second patterns electrically coupled to the memory cells; and
a plurality of third patterns electrically coupled to the upper metal interconnect.

19. The variable resistive memory device of claim 18, wherein the first and second patterns are located on the memory cell array region, and the third patterns are located in a space between the memory cell array regions.

20. The variable resistive memory device of claim 19, wherein the first upper metal interconnect and the second upper metal interconnect extend parallel to each other.

21. The variable resistive memory device of claim 19, wherein the first upper metal interconnect is contact with one of the third patterns and the second upper metal interconnect are in contact with another one of the third patterns.

* * * * *